United States Patent [19]

Sakai et al.

[11] Patent Number: 5,136,358

[45] Date of Patent: Aug. 4, 1992

[54] MULTI-LAYERED WIRING STRUCTURE

[75] Inventors: Kazuhiro Sakai; Hiroyuki Miyake, both of Kanagawa, Japan

[73] Assignee: Fuji Xerox Co., Ltd., Tokyo, Japan

[21] Appl. No.: 710,791

[22] Filed: Jun. 5, 1991

[30] Foreign Application Priority Data

Jun. 6, 1990 [JP] Japan .................. 2-146290

[51] Int. Cl.⁵ .................. H01L 29/40; H01L 23/48; H01L 27/01; H01L 27/12
[52] U.S. Cl. .................. 357/53; 357/71; 357/23.7; 357/4
[58] Field of Search .................. 357/53, 71, 23.7, 4

[56] References Cited

U.S. PATENT DOCUMENTS 4,958,222 9/1990 Takakura et al. .................. 357/53

FOREIGN PATENT DOCUMENTS

| 62-67864 | 3/1987 | Japan . |
| 63-9358 | 1/1988 | Japan . |
| 63-44759 | 2/1988 | Japan . |
| 63-67772 | 3/1988 | Japan . |
| 1-5057 | 1/1989 | Japan . |
| 2-192763 | 7/1990 | Japan . |

*Primary Examiner*—Mark V. Prenty
*Attorney, Agent, or Firm*—Finnegan, Henderson, Farabow, Garrett and Dunner

[57] ABSTRACT

A multi-layered wiring structure includes a plurality of signal lines formed in a common layer and a shield line provided between any two of the lines in a separate layer, with an insulation layer being interposed, for absorbing electrical effects that will occur between the two signal lines. Also, a multi-layered wiring structure includes a plurality of thin-film transistors formed in a common layer and a shield line provided between the source electrode of one such thin-film transistor and the drain electrode of an adjacent thin-film transistor in a separate layer, with an insulation layer being interposed, for absorbing electrical effects that will occur between the source electrode of the one thin-film transistor and the drain electrode of the adjacent thin-film transistor.

4 Claims, 7 Drawing Sheets

MULTI-LAYERED WIRING STRUCTURE

BACKGROUND OF THE INVENTION

The present invention relates to a multi-layered wiring structure for use in electronic devices such as image sensors. More particularly, the present invention relates to a multi-layered wiring structure that reduces electrical effects between signal lines or thin-film transistors to insure that output electric charges will be correctly produced from signal lines or the source electrodes of thin-film transistors.

Common electronic devices having a multi-layered wiring structure are image sensors of facsimile equipment, scanners, etc. In conventional image sensors, particularly in contact image sensors, image information on a document or the like is projected in a one-to-one correspondence to pixels and converted to electric signals. In a certain type of image sensors, the projected image is divided into a multiple of pixels (light-receiving elements) and the charges generated in individual light-receiving elements are stored temporarily, for specified block units, in the capacitance between wires using thin-film transistor elements (TFT) and then read out sequentially as electric signals over time at a speed ranging from several hundred kilohertz to several megahertz. This type of image sensors, generally referred to as a "TFT-driven" image sensor, has the advantage that image can be read by a single driving IC on the basis of the action of TFTs and this contributes to the use of a smaller number of ICs for driving image sensors.

An equivalent circuit diagram for the TFT-driven image sensor is shown in FIG. 5. It basically consists of a linear array of light-receiving elements 11 that is generally equal in length to the width of a document, a charge transfer unit 12 composed of a plurality of thin-film transistors (Ti,j; $i=1-N; j=1-n$) that correspond to the individual light-receiving elements 11' in a one-to-one relationship, and matrix-shaped multi-layered wiring 13.

The array of light-receiving elements 11 is divided into N blocks of light-receiving elements and n light-receiving elements 11' in one block can be regarded to be equivalent to photodiodes (PDi,j; $i=1-N; j=1-n$). Each light-receiving element 11' is connected to the drain electrode of an associated thin-film transistor Ti,j. The source electrodes of thin-film transistors Ti,j are connected via the matrix-shaped multi-layered wiring 13 to n common signal lines 14 for each block of light-receiving elements, with the common signal lines 14 being further connected to a driving IC 15.

The gate electrodes of respective thin-film transistors Ti,j are connected to a gate pulse generator circuit (not shown) to establish conduction for each block. The photoelectric charges generated in respective light-receiving elements 11' are stored for a certain time in their parasitic capacitance and in the drain-gate overlap capacitance of an associated thin-film transistor; thereafter, the charges are sequentially transferred, for each block, to the capacitance (Ci; $i=1-n$) between lines in multi-layered wiring 13 using the thin-film transistors Ti,j as switches for charge transfer and stored there for a certain period of time.

This process is described below in detail. In response to a gate pulse $\phi G1$ from the gate pulse generator circuit, thin-film transistors T1,1−T1,n in the first block turn on and the charges stored temporarily after generation from the light-receiving elements 11' in the first block are transferred for storage in the associated mutual capacitance Ci. The stored charges cause changes in the potentials of the common signal lines 14 and the resulting voltage values are delivered to an output line 16 over time by sequentially turning on analog switches (SWi, $i=1-n$) in the driving IC 15.

Subsequently, in response to gate pulses $\phi G2 - \phi Gn$, the thin-film transistors T2,1−T2,n up to TN,1−TN,n in the second to the Nth blocks are turned on, whereby the charges from the associated light-receiving elements are transferred for each block and read out sequentially so as to obtain a line of image signals from the documents in the fast scan direction. Then, the document is moved by a document feed means such as rollers (not shown) and the above procedure is repeated until image signals for the whole documents are obtained (see Japanese Patent Unexamined Publications No. Sho. 63-9358 and No. Sho. 63-67772).

A specific structure of the matrix-shaped multi-layered wiring 13 used in the prior art system described above is shown in cross section in FIG. 6. As shown, the wiring 13 comprises a substrate 21 having lower signal lines 31, an insulation layer 33 and upper signal lines 32 formed thereon in the order written. In the usual case, the lower signal lines 31 are arranged in such a way that they cross the upper signal lines 32 at right angles, with contact holes 34 being provided to establish connection between the upper and lower signal lines.

A problem with this configuration of the matrix-shaped multi-layered wiring 13 is that crosstalks can occur where the upper signal lines cross the lower signal lines (i.e., a phenomenon in which due to the capacitance that exists at the crossovers of signal lines, a change in the potential of one signal line will be transmitted via the capacitance to the other signal line, thereby changing the potential of the latter). To solve this problem, it has been proposed that an insulation layer 33a, a grounding sheet 35 connected to the ground and a insulation layer 33b are provided between the upper and lower signal lines as shown in cross section in FIG. 7, so that the occurrence of crosstalks is prevented by means of the grounding sheet 35 (see Japanese Patent Unexamined Publication No. Sho. 62-67864).

However, the use of a grounding sheet causes the following two major problems; first, substantial parasitic capacitance develops between each signal line and the grounding sheet; second, the grounding sheet can deflect to cause warpage in the image sensor itself. With a view to solving these problems, as shown in FIG. 8(a) (plan view) and FIG. 8(b) (cross-sectional view), it has been proposed to replace the grounding sheet with a grounding layer 36 that is made of mesh-shaped grounding member with centers at the crossovers of upper and lower signal lines (see Japanese Patent Unexamined Publication No. Sho. 64-5057). It should, however, be noted that for the sake of clarity, only one of each of upper and lower signal lines are shown in FIG. 8(a) by way of example.

Another prior art approach for preventing the occurrence of crosstalks between signal lines arranged parallel to one another in a common layer, is shown in FIG. 5 which is an equivalent circuit diagram for the conventional image sensor and shown more specifically in FIG. 9(a) which is a plan view and in FIG. 9(b) which is a cross section of FIG. 9(a) taken on the line C—C'. A shield line 37a connected to the ground is provided between two adjacent lower signal lines 31 formed in a common layer and another shield line 37b connected to the ground is also provided between two adjacent upper signal lines 32 formed in a common layer.

The major problem with the prior art configurations of the multi-layered wiring 13, particularly with the multi-layered wiring structure shown in FIGS. 9(a) and 9(b) is that as the pixels of an image sensor become finer or more closely packed to reduce its size, it becomes increasingly difficult and even impossible to provide a shield line 37 between adjacent signal lines in a common layer.

To state more specifically, the distance between signal lines that can be drawn from pixels is determined by the pitch of the latter. With current models of image sensors, each of the signal lines and shield lines has a line width of about 9 $\mu$m and the distance between two adjacent signals or between a signal line and a shield line must be at least about 11 $\mu$m. Thus, in order to provide a shield line having a width of about 9 $\mu$m between two adjacent lines, a clearance of at least about 31 $\mu$m (interline distance 11 $\mu$m + shield line width 9 $\mu$m + interline distance 11 $\mu$m) is necessary. This condition can be met by a 400 SPI sensor since the pitch of pixels is as wide as about 63.5 $\mu$m. However, if the pixels become finer and more closely packed to such an extent that their pitch is reduced to smaller than about 31 $\mu$m, it is no longer possible to form a shield line between adjacent signal lines in a common layer in which those signal lines are formed. As a result, crosstalks occur between signal lines arranged parallel to one another in the common layer to make it impossible to read out electric charges in a correct way, and this eventually deteriorates the reproduction of gradation with the image sensor.

This problem does not solely occur between signal lines that are drawn from pixels. As for signal lines arranged parallel to the direction in which a plurality of elongated pixels are formed (i.e., the fast scan direction of the image sensor), namely, upper signal lines 32 shown in FIG. 9(a), the same problem occurs if the distance between adjacent signal lines decreases as in the case where the line width in the slow scan direction is reduced for constructing a compact image sensor.

The problem of crosstalks that occur between adjacent signal lines arranged parallel to each other in a common layer has also been found in the case where a plurality of thin-film transistors are arranged parallel to one another. Before going into details of this problems, let us describe the configuration of a thin-film transistor with reference to FIG. 10 which is a plan view and FIG. 11 which is a cross section of FIG. 10 taken on line D—D'.

The thin-film transistor has a reverse staggered structure and comprises a substrate 21 on which the following layers are superposed in the order written: a chromium (Cr 1) layer serving as a gate electrode 25; a silicon nitride film (SiNx 1) serving as a gate insulation layer 26; a hydrogenated amorphous silicon (a-Si:H) layer serving as a semiconductor active layer 27; a silicon nitride film (SiNx 2) serving as a channel protecting film 29 that is provided to face the gate electrode 25; an n+ hydrogenated amorphous silicon (n+a-Si:H) layer serving as an ohmic contact layer 28; chromium (Cr 2) layers serving as a drain electrode 41 and a source electrode 42; a polyimide layer serving as an insulation layer; and an aluminum layer 30 that is formed on top of the polyimide layer in a position that is above the channel protecting layer 29 and which serves as a metal layer for isolating light to the a-Si:H layer 27.

In an actual device, a plurality of thin-film transistors having the above structure are arranged parallel to one another on the substrate 21 in such a way that the source electrode 42 of one thin-film transistor is positioned very close to the drain electrode 41 of an adjacent thin-film transistor. In each thin-film transistor, the drain electrode 41 usually experiences variations in potential in the order of several volts whereas the source electrode 42 experiences variations in potential in the order of several tens of millivolts. Hence, the source electrode 42 of one thin-film transistor is subject to variations in the potential of the drain electrode 41 of an adjacent thin-film transistor and the resulting crosstalk makes it impossible for electric charges to be correctly read out, whereby the reproduction of gradation from the image sensor is deteriorated.

SUMMARY OF THE INVENTION

The present invention has been achieved under these circumstances and has an object providing an improved multi-layered wiring structure in which even if the distance between adjacent signal lines or between the source electrode of a thin-film transistor and the drain electrode of an adjacent thin-film transistor is small, crosstalks that would otherwise occur between signal lines arranged parallel to each other in a common layer or between the source electrode of a thin-film transistor and the drain electrode of an adjacent thin-film transistor is effectively prevented to insure that electric charges will be correctly read out from each signal line or from the source electrode of each thin-film transistor.

This object of the present invention can be attained by a multi-layered wiring structure having a plurality of signal lines formed in a common layer and a shield line provided between any two of said signal lines in a separate layer, with an insulation layer being interposed, for absorbing electrical effects that will occur between said two signal lines.

The object of the present invention can also be attained by a multi-layered wiring structure having a plurality of thin-film transistors formed in a common layer and a shield line provided between the source electrode of one such thin-film transistor and the drain electrode of an adjacent thin-film transistor in a separate layer, with an insulation layer being interposed, for absorbing electrical effects that will occur between the source electrode of said one thin-film transistor and the drain electrode of said adjacent thin-film transistor.

In the first type of multi-layered wiring structure according to the present invention, the shield line for isolating the electrical effects that occur between signal lines is not formed in the same layer as where those signal lines are formed but, instead, it is formed in a separate layer, with an insulation layer being interposed, in a position that is equidistant from any two adjacent signal lines. Even if the distance between signal lines is very small, the shield line can be formed, with an insulation layer being interposed, in a layer that is different from the layer in which the signal lines are formed. With this arrangement, crosstalks that would otherwise occur between signal lines can be effectively prevented to insure that output electric charges are correctly produced from the individual signal lines.

In the second type of multi-layered wiring structure according to the present invention, the shield line for isolating the electrical effects that occur between the source electrode of a thin-film transistor and the drain electrode of an adjacent thin-film transistor is not formed in the same layer as where said source and drain electrodes are formed but, instead, it is formed in a separate layer, with an insulation layer being interposed, in a position that is equidistant from the source electrode of a thin-film transistor and the drain electrode of an adjacent thin-film transistor. Even if the distance between the source electrode of a thin-film transistor and the drain electrode of an adjacent thin-film transistor is very small, the shield line can be formed, with an insulation layer being interposed, in a layer that is different from the layer in which said source and drain electrodes are formed. With this arrangement, crosstalks that would otherwise occur between the source electrode of thin-film transistor and the drain electrode of an adjacent thin-film transistor can be effectively prevented to insure that output electrical charges are correctly produced from the source electrode of each thin-film transistor.

DETAILED DESCRIPTION OF THE PREFERRED EMBODIMENTS

Embodiments of the present invention will be described below with reference to FIGS. 1-4.

Figure 5:
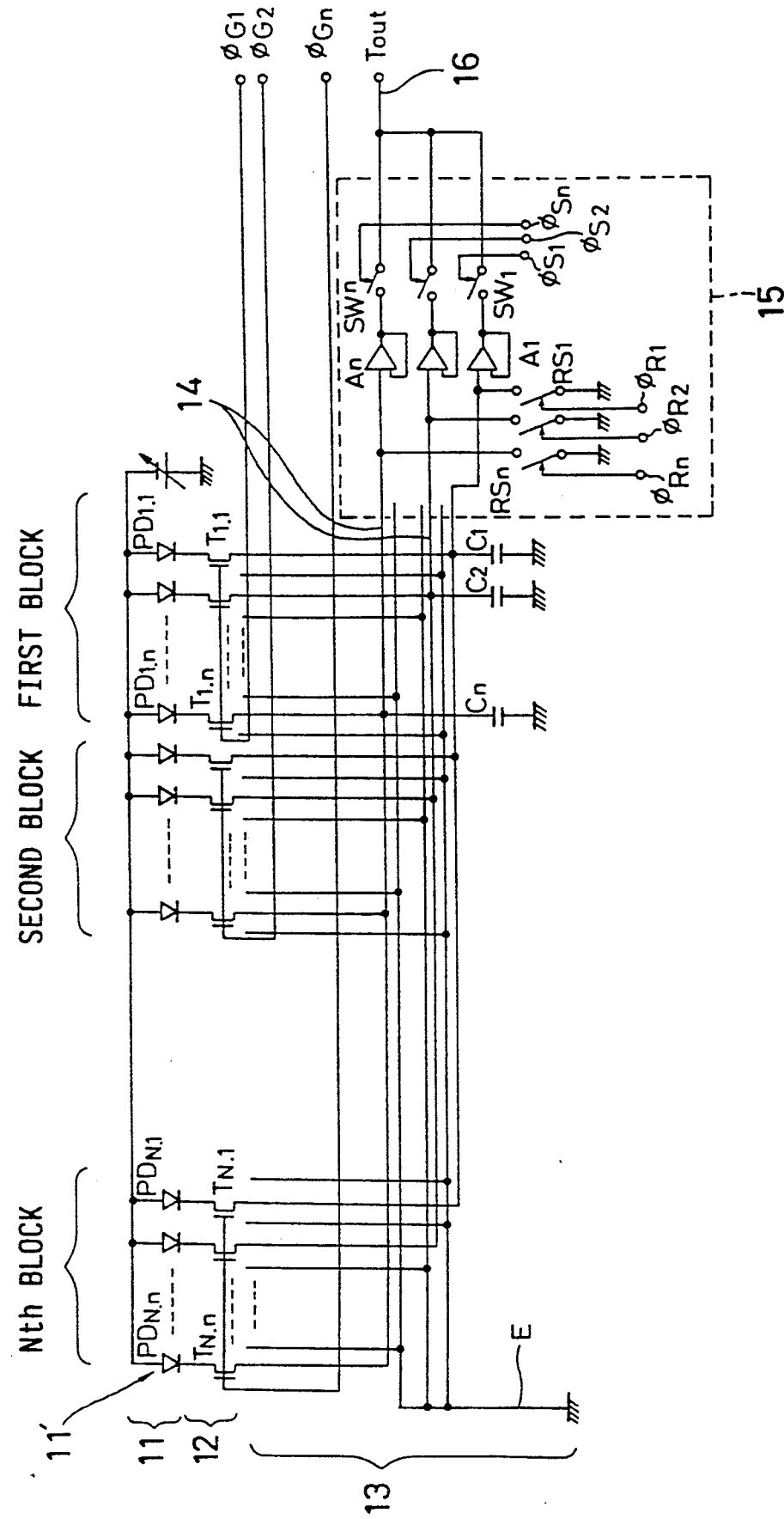
FIG. 5 is an equivalent circuit diagram for a prior art image sensor.
Figure 6:
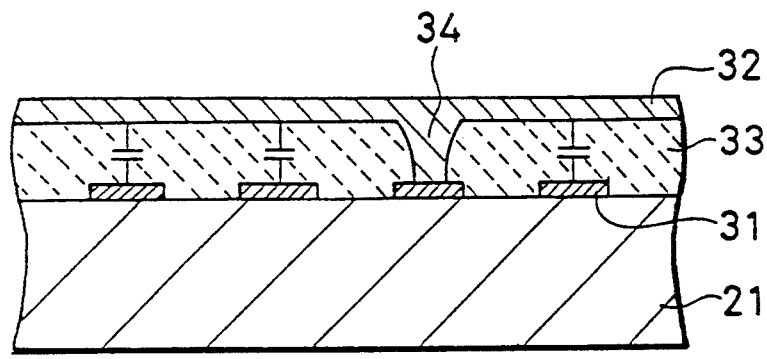
FIG. 6 is a cross-sectional view of a prior art multi-layered wiring.
Figure 7:
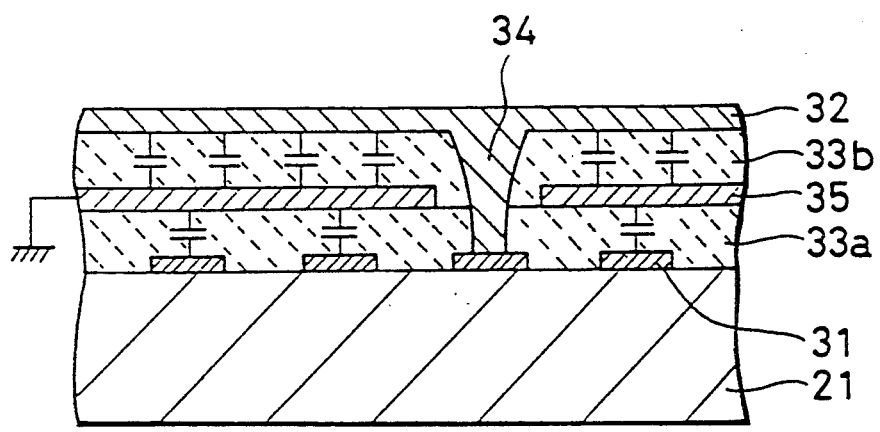
FIG. 7 is a cross-sectional view of a prior art multi-layered wiring having a grounding sheet.
Figure 8A:
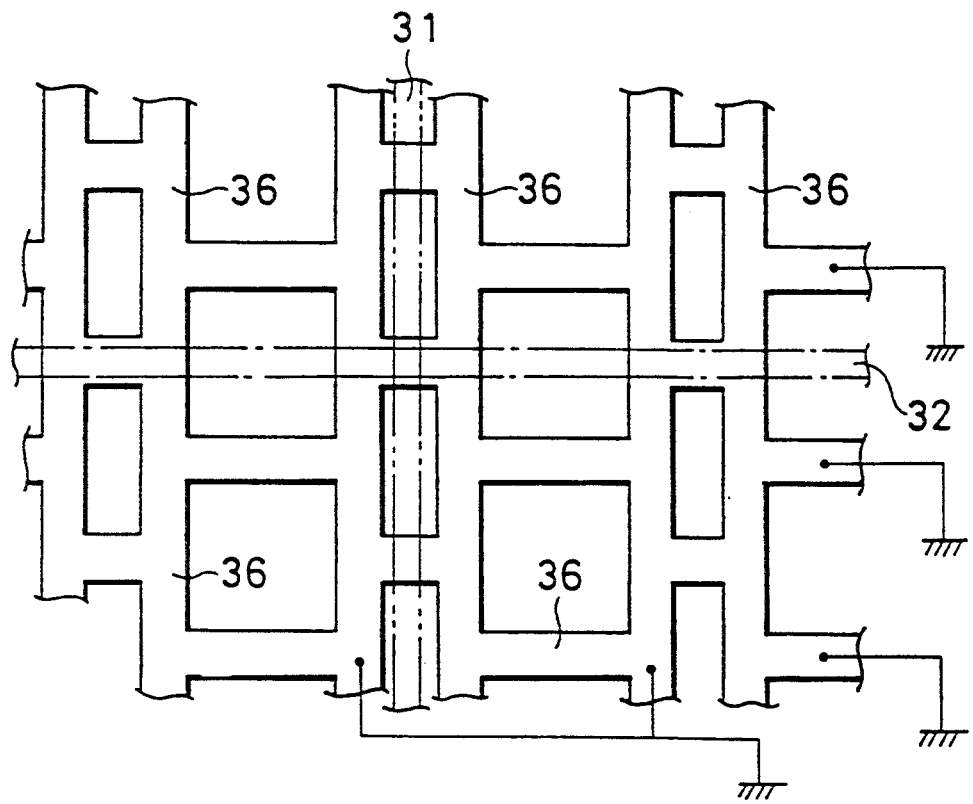
FIGS. 8(a) and 8(b) are a plan view and a cross-sectional view, respectively, of a prior art multi-layered wiring having a mesh-shaped grounding layer.
Figure 8B:
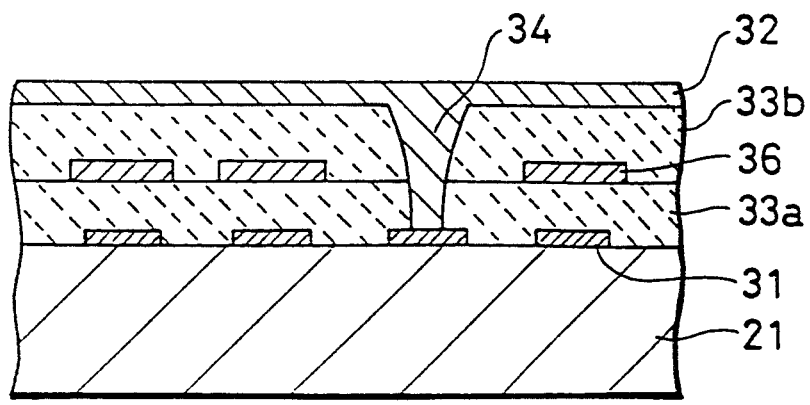
Figure 9A:
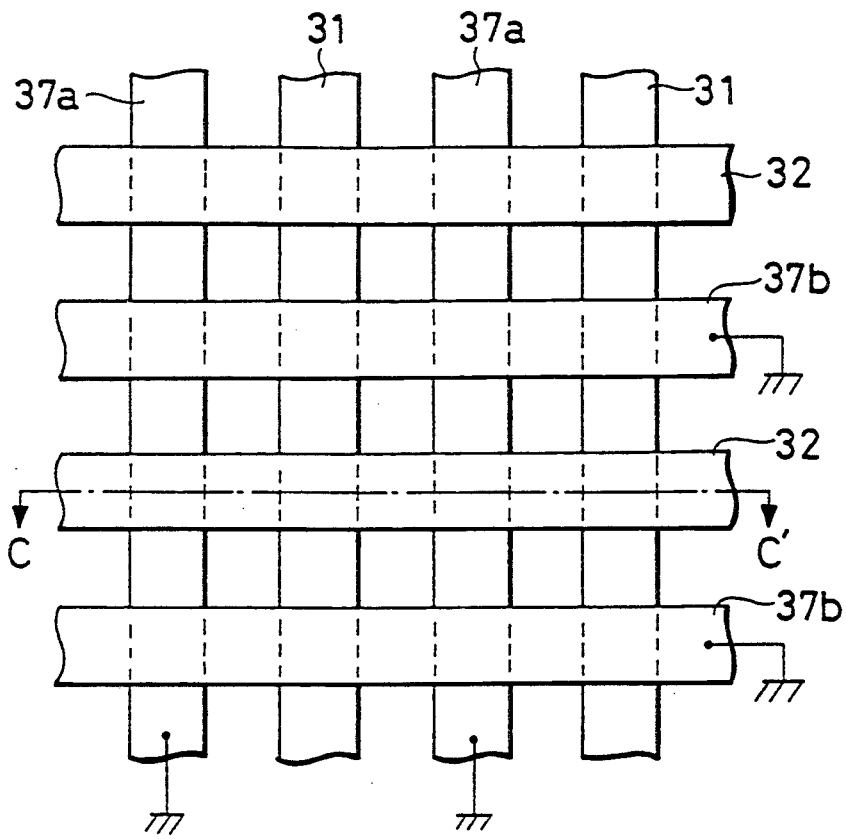
FIGS. 9(a) and 9(b) are a plan view and a cross-sectional view, respectively, of a prior art multi-layered wiring having shield lines between signal lines.
Figure 9B:
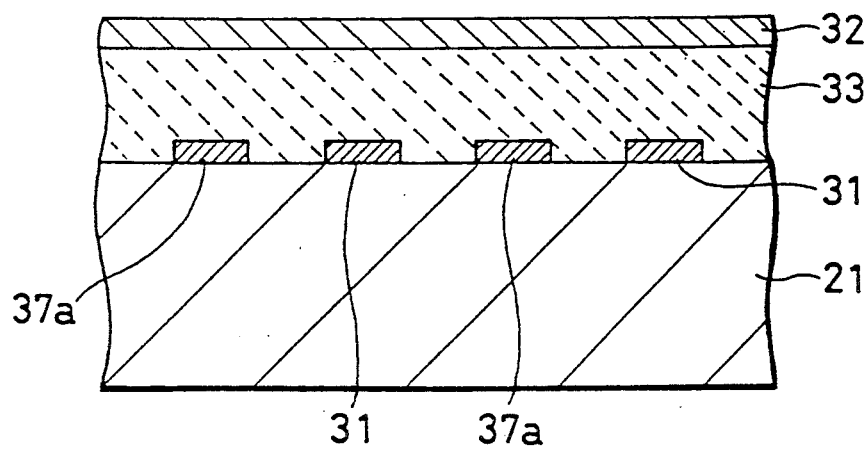

While multi-layered wiring structures are employed in various electronic devices, the following description of the preferred embodiments of the present invention centers on the multi-layered wiring 13 shown in FIG. 5 which is an equivalent circuit diagram of the prior art image sensor.

Figure 1:
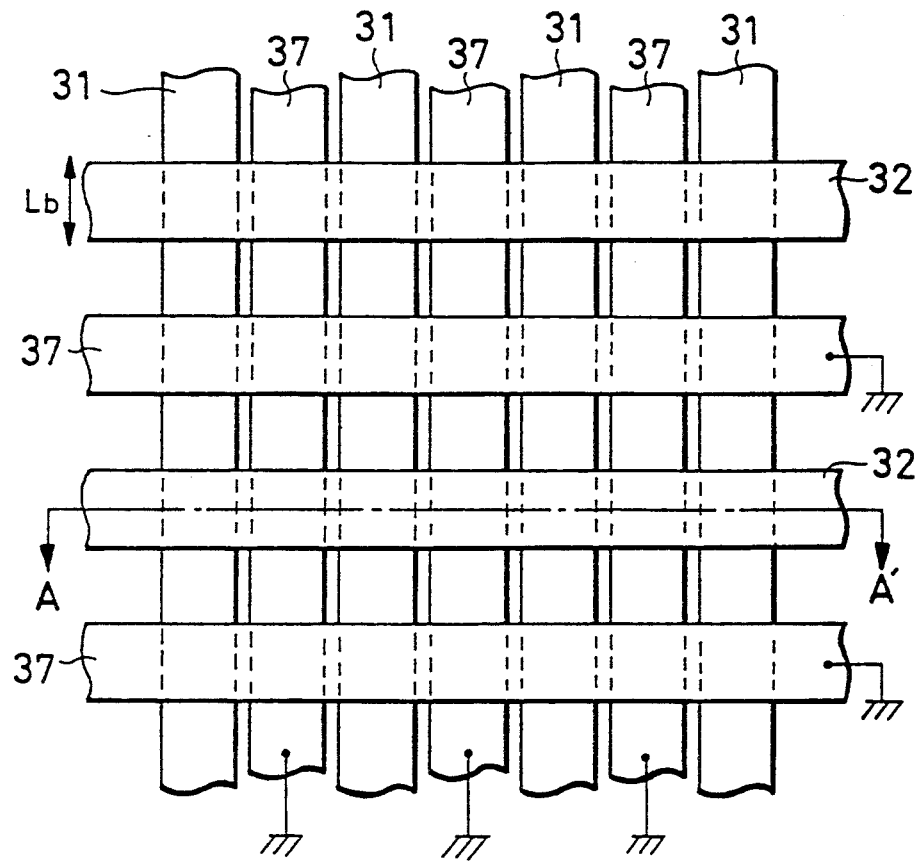
FIG. 1 is a plan view illustrating a multi-layered wiring structure according to an embodiment of the present invention.
Figure 2:
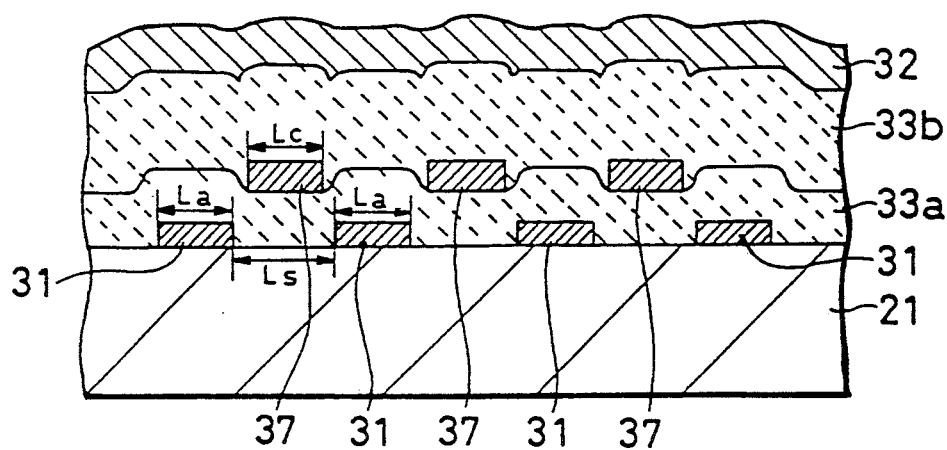
FIG. 2 is a cross section of FIG. 1 taken on line A—A'.

FIG. 1 is a plan view illustrating a multi-layered wiring structure according to one embodiment of the present invention, and FIG. 2 is a cross section of FIG. 1 taken on line A—A'.

As shown in FIGS. 1 and 2, the multi-layered wiring structure of the first embodiment comprises a substrate 21 that is made of an insulator such as glass and which has the following components superposed in the order written: lower signal lines 31 formed of chromium (Cr); a first insulation layer 33a made of silicone nitride (SiNx); shield liens 37 that are formed of chromium (Cr) on top of the first insulation layer 33a in positions that are parallel to and equidistant from any two adjacent lower signal lines 31; a second insulation layer 33b made of polyimide; and upper signal lines 32 that are formed of aluminum (Al) on top of the second insulation layer 33b in such a way that they cross the lower signal liens 31 at right angles. The shield lines 37 are connected to either ground level or a constant potential.

To describe the dimensional features of the embodiment under discussion, each of the lower signal lines 31 has a width (La) of about 9 μm; the distance (Ls) between adjacent lower signal lines 31 is about 11 μm; the chromium (Cr) layer forming the lower signal lines 31 has a thickness of about 750 Å; the silicon nitride (SiNx) layer forming the first insulation layer 33a has a thickness of about 3000 Å; each of the shield lines 37 formed over the first insulation layer 33a has a width (Lc) of about 9 μm; the chromium (Cr) layer forming the shield line 37 has a thickness of about 1500 Å; the overlying second insulation layer 33b made of polyimide has a thickness of about 13000 Å; each of the upper signal liens 32 formed over the second insulation layer 33b has a width (Lb) of about 9 μm; and the aluminum (Al) layer forming the upper signal lines 32 has a thickness of about 10000 Å.

The shield lines 37 in the multi-layered wiring 13 under consideration is formed of chromium (Cr). If chromium is replaced by tantalum which is more resistant to galvanic corrosion, a multi-layered wiring structure of even higher reliability can be fabricated.

In the embodiment under consideration, the shield lines 37 have a line width (Lc) of about 9 μm. In order to insure more positive prevention of crosstalks between adjacent lower signal lines 31, it is effective to increase the line width (Lc) of each shield line 37. Therefore, Lc (the line width of shield line 37) may be greater than Ls (the distance between adjacent lower signal lines 31).

If the coupling capacitance between a signal line and a shield line increases, the sensitivity of the image sensor will deteriorate. To avoid this problem, it is recommended that Lc (the line width of shield line 37) is smaller than Ls (the distance between adjacent lower signal lines 31).

The process for fabricating the multi-layered wiring structure under consideration will be described below.

The process starts with preparing an inspected and cleaned substrate 21 made of an insulator such as glass. The first Cr (Cr 1) layer which is to serve as the lower signal lines 31 in the multi-layered wiring 13 is deposited on the substrate 21 in a thickness of about 750 Å by DC sputtering. The Cr 1 layer is then patterned by a photo-lithographic procedure plus an etching process using a liquid mixture of ammonium ceric nitrate, perchloric acid and water. After forming a pattern of the lower signal lines 31 in the multi-layered wiring 13, the resist is stripped. In the next step, silicon nitride (SiNx) is deposited over the Cr 1 pattern in a thickness of about 3000 Å by plasma-assisted CVD (P-CVD) in order to form the first insulation layer 33a.

The following conditions may be used to form the first insulation layer 33a of silicon nitride (SiNx) by P-CVD: the substrate temperature is set at 300°–400° C.; the gas pressures of SiH$_4$ and NH$_3$ are adjusted to 0.1–0.5 Torr; the flow rate of SiH$_4$ gas is adjusted to 10–50 sccm; the flow rate of $NH_3$ gas is adjusted to 100–300 sccm; and the RF power is set at 50–200 W.

Subsequently, contact holes for establishing connection between the upper and lower signal lines are formed in the first insulation layer 33a by the following procedure: a resist is coated and etching is performed by exposure through a photolithographic mask and development. When the resist is stripped, contact holes 34 are left in the first insulation layer 33a.

In the next step, the second Cr (Cr 2) layer which is to serve as the shield lines 37 is deposited in a thickness of about 1500 Å by DC magnetron sputtering. The Cr 2 layer is patterned by a photolithographic procedure plus an etching process using a liquid mixture of ammonium ceric nitrate, perchloric acid and water. By stripping the resist, a pattern of shield lines 37 is formed.

Thereafter, a polyimide coat which is to serve as the second insulation layer 33b is applied in a thickness of about 13000 Å to cover the entire surface of the substrate. The applied polyimide coat is prebaked at about 160° C., patterned by photolithographic etching procedures and baked again, whereupon contact holes 34 are formed in the second insulation layer 33b to establish connection between the upper and lower signal lines. In order to remove any polyimide that remains in holes 34 and elsewhere, descumming is performed by exposure to an oxygen ($O_2$) plasma.

In the next step, an aluminum (Al) coat is deposited in a thickness of about 10,000 Å by DC magnetron sputtering to cover the entire surface of the substrate. The applied Al coat is then patterned by photolithographic etching procedures using a liquid mixture of fluoric acid, nitric acid, phosphoric acid and water, whereupon a pattern of upper signal lines 32 are formed in the multi-layered wiring structure 13. In this step, a shield line may be formed of aluminum between adjacent upper signal lines 32 in the same layer as where those signal lines are formed.

If the distance between adjacent upper signal lines 32 is too small to permit the formation of shield lines in the common layer, the latter may be formed above upper signal lines 32, with an insulation layer being interposed, in a separate layer at a position intermediate between adjacent upper signal lines 32 in the same manner as described in connection with the provision of shield lines, with an insulation layer being interposed, for the purpose of preventing the occurrence of crosstalks between lower signal lines 31. By adopting this arrangement, the distance between upper signal lines 32 can be sufficiently reduced to realize an even smaller image sensor.

In the last step, a polyimide coat which is to serve as a passivation layer (not shown) is applied in a thickness of about 3 μm. The applied polyimide coat is prebaked at 125° C., patterned by photolithographic etching procedures and further baked at 230° C. for 90 min to thereby form a passivation layer. Subsequently, descumming is performed to remove any unwanted residual polyimide. In this way, a protective film is formed over the multi-layered wiring 13.

In the multi-layered wiring structure according to the first embodiment described above, the shield line 37 that is connected to the ground and which isolates the electrical effects due to crosstalks that occur between lower signal lines 31 is not formed of the same metal layer (Cr 1) as the lower signal lines 31 are formed but, instead, it is formed of different metal layer (Cr 2) in a separate layer, with the first insulation layer 33a being interposed, in a position that is equidistant from any two adjacent lower signal lines 31. Even if the distance between lower signal lines 31 is very small, the shield line 37 can be formed, with the first insulation layer 33a being interposed, in a layer that is different from the layer in which the lower signal lines 31 are formed. With this arrangement, crosstalks that would otherwise occur between lower signal lines 31 can be effectively prevented to insure that output electric charges are correctly produced from the individual lower signal lines 31 so as to improve the reproduction of gradation from the image sensor.

If desired, a shield line for upper signal lines 32 can be formed of a different metal layer in a different layer, with an insulation layer being interposed, in a position that is equidistant from any two adjacent upper signal lines 32. With this arrangement, crosstalks that would otherwise occur between upper signal lines 32 can be effectively prevented to insure that output electric charges are correctly produced from the individual upper signal lines 32 so as to improve the reproduction of gradation from the image sensor.

A further advantage of the first embodiment is that it is capable of effectively preventing the occurrence of crosstalks between upper and lower signal lines since the first insulation layer 33a, the shield lines 37 and the second insulation layer 33b are provided between the array of lower signal lines 31 and that of upper signal lines 32.

When a TFT-driven image sensor is to be fabricated using multi-layered wiring structure of the above-described feature in the multi-layered wiring 13, the efficiency of production process can be improved by adopting the following procedure: Cr 1 is deposited and patterned simultaneously with the formation of the chromium layer which serves as the gate electrode of each of the thin-film transistors in the charge transfer unit 12; and Cr 2 is deposited and patterned simultaneously with the formation of the chromium layer for the metal electrode which serves as the lower electrode in strip form of each light-receiving element 11', as well as with the formation of the chromium layer which serves as the drain and source electrodes of each of the thin-film transistors in the charge transfer unit 12.

While the foregoing description of the multi-layered wiring structure is directed to the multi-layered wiring 13 in a TFT-driven image sensor, it should be noted that said multi-layered wiring structure is applicable not only to image sensors but also to all electronic devices in which a plurality of signal lines are formed parallel to one another in a common layer, with the inter-line distance being so small as to preclude the provision of a shield line between adjacent signal lines.

If, in the absence of shield lines 37 of the type described in connection with the first embodiment, an aluminum (Al) film were deposited to form the upper signal lines 32, the steps in the aluminum layer would become higher than when shield lines 37 were provided and this could potentially cause a breakage in the upper signal lines 32. On the other hand, if a shield line 37 is provided between lower signal lines 31, with the first insulation layer 33a being interposed, the height of the steps in the aluminum layer forming the upper signal lines 32 is somewhat reduced to insure effective prevention of the breakage of upper signal lines 32.

The first embodiment described above relates to a solution to the problem that the distance between two parallel signal lines is too small to form a shield line in a common layer to the signal lines for preventing the occurrence of crosstalks between adjacent signal lines. The same problem will occur in the case where a plurality of thin-film transistors are arranged parallel to one another on a common substrate and the multi-layered wiring structure of the present invention can also be applied to cope with this situation.

Figure 3:
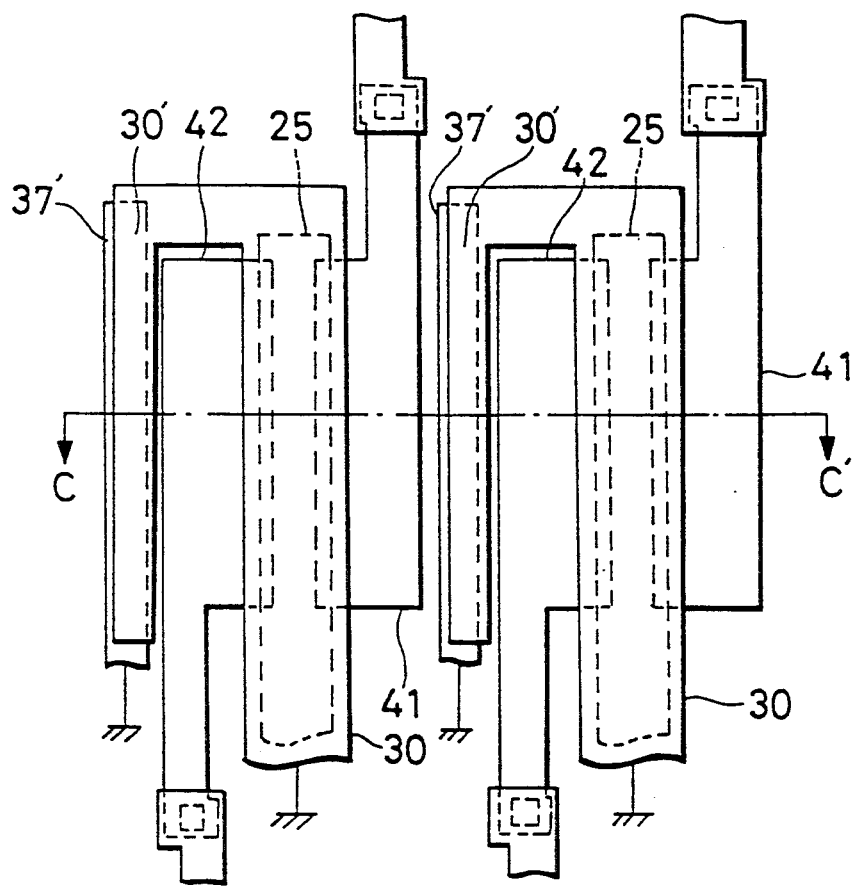
FIG. 3 is a plan view illustrating a multi-layered wiring structure according to another embodiment of the present invention.
Figure 4:
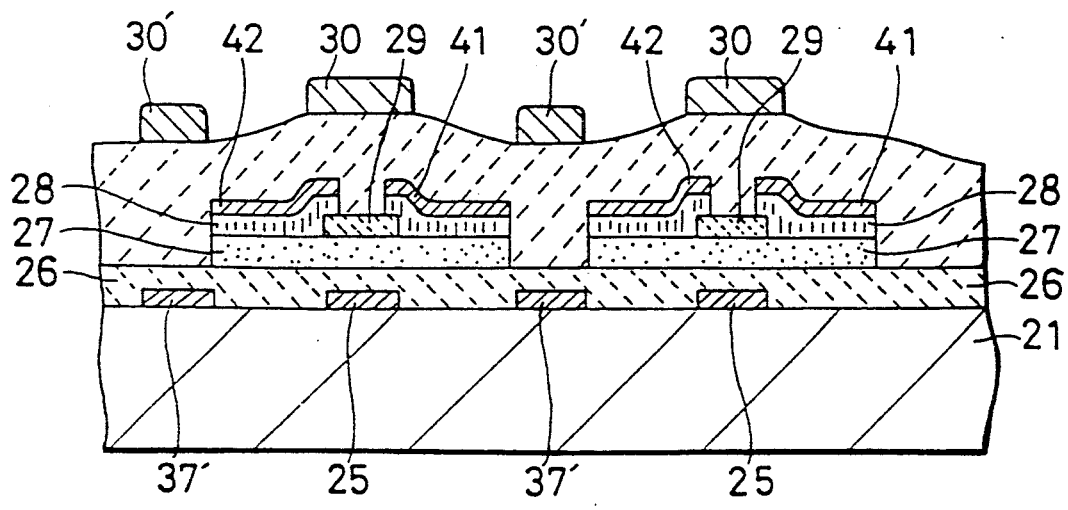
FIG. 4 is a cross section of FIG. 3 taken on line C—C'.

On the pages that follow, a second embodiment of the present invention which relates to a multi-layered wiring structure especially intended to isolate electrical effects between thin-film transistors will be described with reference to FIG. 3 which is a plan view and to FIG. 4 which is a cross section of FIG. 3 taken on line C—C'.

Figure 10:
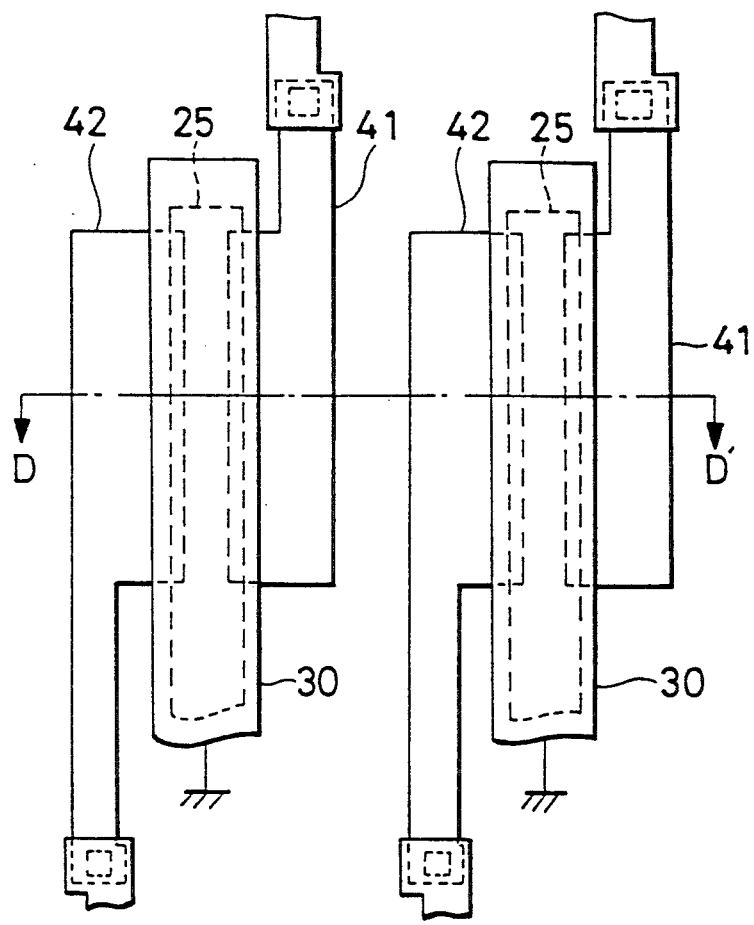
FIG. 10 is a plan view of a prior art thin-film transistor array.
Figure 11:
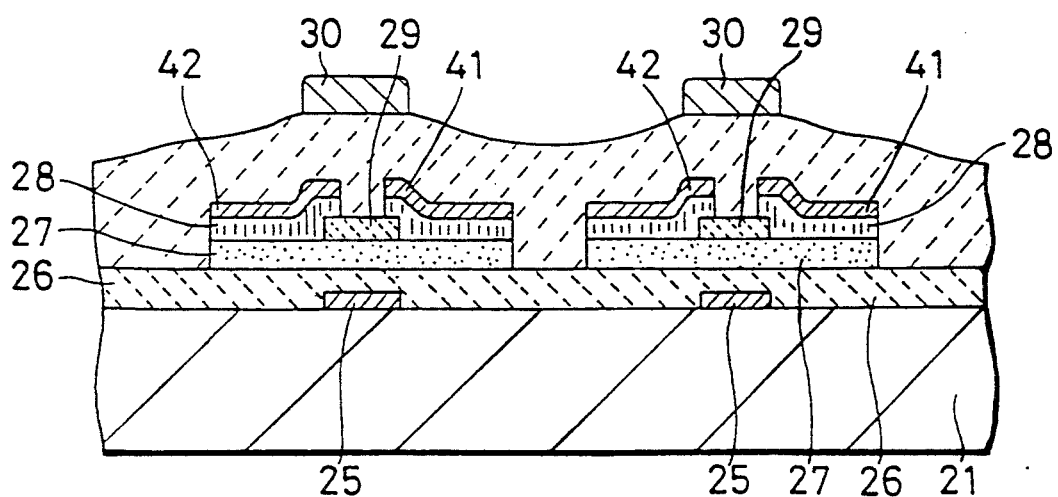
FIG. 11 is a cross section of FIG. 10 taken on line D—D'.

To begin with, the specific configuration of each thin-film transistor used in the second embodiment is described with reference to FIGS. 3 and 4. The components which are of the same configuration as in FIGS. 10 and 11 will be described using the same numerals and symbols.

The thin-film transistor has a reverse staggered structure and comprises a substrate 21 on which the following layers are superposed in the order written: a chromium (Cr 1) layer serving as a gate electrode 25; a silicon nitride film (SiNx 1) serving as a gate insulation layer 26; a hydrogenated amorphous silicon (a-Si:H) layer serving as a semiconductor active layer 27; a silicon nitride film (SiNx 2) serving as a channel protecting film 29 that is provided to face the gate electrode 25; an n+ hydrogenated amorphous silicon (n+a-Si:H) layer serving as an ohmic contact layer 28; chromium (Cr 2) layers serving as a drain electrode 41 and a source electrode 42; a polyimide layer serving as an insulation layer; and an aluminum layer 30 that is formed on top of the polyimide layer in a position that is above the channel protecting layer 29 and which serves as a metal layer for isolating light to the a-Si:H layer.

In the embodiment under consideration, a lower shield line 37' is formed of Cr 1 between adjacent thin-film transistors. Further, as shown in FIG. 3, the aluminum layer 30 serving as a metal layer for isolating light to the a-Si:H layer is changed in shape to provide a hook-shaped upper shield line 30' that effectively surrounds the source electrode 42. Both the lower shield line 37' and the upper shield line 30' are connected to either ground level or a constant potential.

The inherent object of the present invention is to solve the problem associated with an extremely small distance between signal lines by forming a shield line not in a common layer to the signal lines but in a position between any two signal lines and in a separate layer which may be either above or below the signal lines or both. Thus, if the drain electrode 41 and the source electrode 42 are regarded as signal lines, a shield line is to be formed in a position between the drain electrode 41 and the source electrode 42 and in a different layer than where those two electrodes are formed which may be either above or below or both. In the second embodiment of the present invention under discussion, the upper shield line 30' is formed in an upper layer whereas the lower shield line 37' is formed in a lower layer.

The thin-film transistors to be used in the second embodiment can be fabricated by the following process.

To begin with, the first Cr (Cr 1) layer which is to provide the gate electrode 25 of each thin-film transistor and the lower shield line 37' is deposited on the substrate 21 in a thickness of about 750 Å by DC sputtering. The Cr 1 layer is then patterned by photolithographic etching procedures to form a pattern of the gate electrodes 25 of thin-film transistors and a pattern of the lower shield lines 37'. To form the gate insulation film 26 of each thin-film transistor, semiconductor active layer 27 and channel protecting film 29 in superposition on the Cr 1 pattern, SiNx 1, a-Si:H and SiNx 2 are successively deposited in respective thicknesses of about 3000 Å, 500 Å and 1500 Å by plasma-assisted CVD (P-CVD) without destroying the vacuum.

In the next step, in order to form a pattern of channel protecting films 29 in correspondence to the gate electrodes 25, a resist is coated on the gate insulation film 26 and etched by a process consisting of base-side exposure (light is applied to the back side of the substrate 21), with the shape pattern of gate electrodes 25 being used as a mask, and development. As a result, a pattern of channel protecting films 29 is formed.

Subsequently, to form the ohmic contact layer 28, a-Si:H of n+ type is deposited in a thickness of about 1000 Å by P-CVD. In the next step, the second Cr (Cr 2) layer which is to serve as the source electrode 41 and drain electrode 42 of each thin-film transistor is deposited in a thickness of about 1500 Å by DC magnetron sputtering.

Then, the Cr 2 layer which is to serve as the source electrode 41 and the drain electrode 42 of each thin-film transistor is patterned by the combination of photolithographic and etching processes so as to form a pattern of source electrodes 41 and drain electrodes 42. Thereafter, the area corresponding to each thin-film transistor is etched with a gaseous mixture of $CF_4$ and $O_2$, whereupon the areas where Cr 2 and SiNx are absent are etched away to leave a pattern of a-Si:H layer and n a-Si:H layer. In this way, the n+ type a-Si:H layer for the ohmic contact layer 28 of each thin-film transistor and the a-Si:H layer for the semiconductor active layer 27 are etched.

In the next step, a polyimide coat which is to serve as the second insulation layer 33b is applied in a thickness of about 13,000 Å to cover the entire surface of the substrate. The applied polyimide coat is prebaked, patterned by photolithographic etching procedures and baked again, followed by a descumming operation.

Subsequently, an aluminum (Al) coat is deposited in a thickness of about 15,000 Å by DC magnetron sputtering to cover the entire surface of the substrate. The applied Al coat is then patterned by photolithographic etching procedures to form an aluminum layer in the wiring connected to the drain electrode 41 of each thin-film transistor and in the wiring connected to the source electrode 42, the aluminum layer 30 serving as a metal layer for isolating light to the a-Si:H layer, and the hook-shaped upper shield line 30'.

In the last step, a polyimide coat which is to serve as a passivation layer (not shown) is applied, prebaked, patterned by photolithographic etching procedures and further baked to form a passivation layer. Subsequently, descumming is performed to remove any unwanted residual polyimide. In this way, an array of thin-film transistors is fabricated.

In the multi-layered wiring structure according to the second embodiment described above, the lower shield line 37' and the hook-shaped upper shield line 30' for isolating the electrical effects that occur between the source electrode 42 of a thin-film transistor and the drain electrode 41 of an adjacent thin-film transistor are not formed in the same layer as where the source electrode 42 and the drain electrode 41 of each thin-film transistor are formed but, instead, they are formed in separated layers that are above and below said layer, with insulation layers being interposed, in positions that are equidistant from the source electrode 42 of one thin-film transistor and the drain electrode 41 of an adjacent thin-film transistor. Even if the source electrode 42 of one thin-film transistor is very close to the drain electrode 41 of an adjacent thin-film transistor, the lower shield line 37' and the upper shield line 30' can be formed, with insulation layers being interposed, in layers that are different from the layer in which the source and drain electrodes are formed. With this arrangement, crosstalks that would otherwise occur between the source electrode 42 of a thin-film transistor and the drain electrode 41 of an adjacent thin-film transistor can be effectively prevented to insure that output electric signals are correctly produced from the source electrode 42 of each thin-film transistor so as to improve the reproduction of gradation from the image sensor.

In the embodiment described above, the occurrence of crosstalks between the source electrode 42 of a thin-film transistor and the drain electrode 41 of an adjacent thin-film transistor is prevented by the upper shield line 30' and the lower shield line 37' which are formed not in the same layer as where the source electrode 42 and the drain electrode 41 of each thin-film transistor are formed but which are formed in two different layers, with the insulation layers SiNx 1 and SiNx 2 being interposed, one being above and the other below the layer where the source and drain electrodes are formed. If desired, either the upper shield line 30' or the lower shield line 37' may be selectively formed and this arrangement is also effective for the purpose of isolating unwanted electrical effects that can occur between adjacent thin-film transistors.

What is claimed is:

1. A multi-layered wiring structure, comprising:
   a plurality of signal lines formed in a same plane of a common layer; and
   a shield line provided between any two of said signal liens and in a same plane of a separate layer, with an insulation layer being interposed between said common layer and said separate layer, for absorbing electrical effects between said two signal liens in said same plane of said common layer.

2. A multi-layered wiring structure, comprising:
   a first electrode and a second electrode of a plurality of thin-film transistors formed in a common layer; and
   a shield line provided between said first electrode of one of said thin-film transistors and said second electrode of another of said thin-film transistors adjacent said one of said thin-film transistors in a separate layer, said separate layer being a different layer than said common layer, with an insulation layer being interposed between said common layer and said separate layer, for absorbing electrical effects between said first electrode of said one thin-film transistor and said second electrode of said another adjacent thin-film transistor.

3. A multi-layered wiring structure as claimed in claim 1, wherein said shield line has a portion that does not overlap said signal lines.

4. The multi-layered wiring structure according to claim 2, wherein said first electrode is a source electrode and said second electrode is a drain electrode.

* * * * *

UNITED STATES PATENT AND TRADEMARK OFFICE
CERTIFICATE OF CORRECTION

PATENT NO. : 5,136,358

DATED : August 04, 1992

INVENTOR(S) : Kazuhiro Sakai et al.

It is certified that error appears in the above-identified patent and that said Letters Patent is hereby corrected as shown below:

Claim 1, column 12, line 8, change "liens" to --lines--.

Claim 1, column 12, line 11, change "liens" to --lines--.

Signed and Sealed this

Twelfth Day of October, 1993

Attest:

BRUCE LEHMAN

Attesting Officer

Commissioner of Patents and Trademarks